United States Patent
Burgess et al.

(10) Patent No.: US 10,601,388 B2
(45) Date of Patent: Mar. 24, 2020

(54) METHOD OF DEPOSITION

(71) Applicant: SPTS TECHNOLOGIES LIMITED, Newport (GB)

(72) Inventors: Stephen R Burgess, Gwent (GB); Rhonda Hyndman, Newport (GB); Amit Rastogi, Newport (GB); Scott Haymore, Newport (GB); Constanine Fragos, Newport (GB)

(*) Notice: Subject to any disclaimer, the term of this patent is extended or adjusted under 35 U.S.C. 154(b) by 0 days.

(21) Appl. No.: 15/286,283

(22) Filed: Oct. 5, 2016

(65) Prior Publication Data
US 2017/0104465 A1 Apr. 13, 2017

(30) Foreign Application Priority Data
Oct. 9, 2015 (GB) .................................. 1517879.1

(51) Int. Cl.
*H02H 3/02* (2006.01)
*C23C 14/00* (2006.01)
(Continued)

(52) U.S. Cl.
CPC .......... *H03H 3/02* (2013.01); *C23C 14/0036* (2013.01); *C23C 14/0641* (2013.01);
(Continued)

(58) Field of Classification Search
CPC .................. C23C 14/0036; C23C 14/0641
See application file for complete search history.

(56) References Cited

U.S. PATENT DOCUMENTS 5,976,327 A * 11/1999 Tanaka .................. C23C 14/046
204/192.12
6,936,837 B2 8/2005 Yamada et al.
(Continued)

FOREIGN PATENT DOCUMENTS

CN 100509224 7/2009
CN 101824592 B 7/2011
(Continued)

OTHER PUBLICATIONS

Mishin, Sergey et al., "Method of controlling coupling coefficient of Aluminum Scandium Nitride deposition in high volume production."
(Continued)

*Primary Examiner* — John J Brayton
(74) *Attorney, Agent, or Firm* — Hodgson Russ LLP

(57) ABSTRACT

A method is for depositing by pulsed DC reactive sputtering an additive containing aluminium nitride film containing at least one additive element selected from Sc, Y, Ti, Cr, Mg and Hf. The method includes depositing a first layer of the additive containing aluminium nitride film onto a film support by pulsed DC reactive sputtering with an electrical bias power applied to the film support. The method further includes depositing a second layer of the additive containing aluminium nitride film onto the first layer by pulsed DC reactive sputtering with no electrical bias power applied to the film support or with an electrical bias power applied to the film support which is lower than the electrical bias power applied during the sputter deposition of the first layer, where the second layer has the same composition as the first layer.

17 Claims, 7 Drawing Sheets

(51) Int. Cl.
| | |
|---|---|
| *C23C 14/34* | (2006.01) |
| *C23C 14/06* | (2006.01) |
| *C23C 14/14* | (2006.01) |
| *H03H 9/02* | (2006.01) |
| *H03H 3/02* | (2006.01) |

(52) U.S. Cl.
CPC ............ *C23C 14/14* (2013.01); *C23C 14/345* (2013.01); *C23C 14/3414* (2013.01); *C23C 14/3485* (2013.01); *H03H 9/02047* (2013.01)

(56) References Cited

U.S. PATENT DOCUMENTS

| | | | |
|---|---|---|---|
| 7,758,950 B2 * | 7/2010 | Moriguchi | C23C 14/0015 428/212 |
| 7,758,979 B2 | 7/2010 | Akiyama et al. | |
| 2009/0246385 A1 * | 10/2009 | Felmetsger | C23C 14/024 427/301 |
| 2014/0167560 A1 | 6/2014 | Onda | |
| 2014/0234616 A1 * | 8/2014 | Hultman | C23C 14/0641 428/336 |
| 2014/0354109 A1 | 12/2014 | Grannen et al. | |
| 2015/0311046 A1 * | 10/2015 | Yeh | H01J 37/3405 204/192.17 |

FOREIGN PATENT DOCUMENTS

| | | |
|---|---|---|
| CN | 104428441 B | 4/2017 |
| CN | 104883153 | 6/2018 |
| WO | WO2014/094884 A1 | 6/2014 |
| WO | WO 2014/122667 A1 | 8/2014 |

OTHER PUBLICATIONS

British Search Report dated Apr. 27, 2016.
Matloub R Et al: "Piezoelectric AlScN thin films: A semiconductor compatible solution for mechanical energy harvesting and sensors". Applied Physics Letters, AIP Publishing LLC, US, vol. 102, No. 15, Apr. 15, 2013 [ISSN: 003-6951, DOI: 10.1063/1.4800231].
P.M Mayrhofer Et al: "Circular test structure for the determination of piezoelectric constants of ScxAl1-xN thin films applying Laser Doppler Vibrometry and FEM simulations", Sensors and actuators A: Physical, vol. 222, Oct. 31, 2014 [ISSN: 0924-4247, DOI: 10.1016/j.sna.2014.10.024].
Greczynski Grzegorz Et al: "Metal versus rare-gas ion irradiation during TiAlN film growth by hybrid high power pulsed magnetron/dc magnetron co-sputtering using synchronized pulsed substrate bias", Journal of vacuum science and technology: Part A, AVS/AIP, Melville, NY., US, vol. 30, No. 6, Nov. 1, 2012 [ISSN: 0734-2101, DOI: 10.1116/1.4750485].
Chinese Office Action dated Jul. 23, 2019 Related to Chinese Application No. 201610884531.0.

* cited by examiner (a)

1.5 μm ALN Film (b)

1.5 μm AlScN (a)

Center (b)

Edge (a)

Center (b)

Edge

METHOD OF DEPOSITION

BACKGROUND

This invention relates to methods of depositing by pulsed DC reactive sputtering an additive containing aluminium nitride film. The invention relates also to the films themselves and to piezoelectric devices comprising these films.

There is interest in the production of AlN thin films, not least because of their piezoelectric properties. A potentially important application is in Bulk Acoustic Wave (BAW) frequency resonating devices. BAW devices consist of a resonating piezoelectric layer (usually aluminium nitride) sandwiched between two electrodes. This is a technology enabler for the mobile communications industry, as they can be used to manufacture small, cheap precision filters with high rejection, low loss and very low temperature drift. Sputtered aluminium nitride is widely used in the manufacture of BAW filters, mainly because of its relatively high piezoelectric constant, which is the highest amongst common tetrahedral bonded binary semiconductors. However, a drawback is that aluminium nitride films inherently have a rather low electromechanical coupling coefficient which sets a limit of the achievable band width of aluminium nitride containing filters.

In order to improve the piezoelectric properties of aluminium nitride thin films, it has been suggested to incorporate metal additives such as Sc, Y, Ti, Cr, Mg and Hf. For example, scandium may be incorporated into the alloy at the expense of aluminium. Because the Sc—N bond is 0.35 A longer than the Al—N bond length of 1.9 A, a stress is created in the film owing to this difference in bond length. As a consequence of the variable bond length, the alloy material becomes softer. However, with the larger unit cell there is a significant improvement in the electromechanical coupling coefficient. This can be seen in FIG. 1, which shows electromechanical coupling coefficient as a percentage of stress for $Al_{93.9}Sc_{6.1}N$ in comparison to pure aluminium nitride films. At zero film stress, the $Al_{93.9}Sc_{6.1}N$ film exhibits a coupling coefficient of about 8% in comparison to a coupling coefficient of 6.2% for the pure aluminium nitride film. This represents a relative improvement in coupling coefficient of about 30%. It is understood that when the composition is expressed in the form $Al_{100-x}Sc_xN$, the values $_{100-x}$ and $_x$ are expressed as percentages, and $_x$ as a percentage can be equated to $_{0.0x}$ in stoichiometric chemical terms.

It can also be seen in FIG. 1 that a higher coupling coefficient is achieved with a more tensile film. However, highly stressed films are not suitable for large scale BAW manufacture, because they are liable to crack and peel. This can result in problems with regard to reliability later on in the manufacturing process. Another problem that has been observed with AlScN films thicker than around 300 nm, is that they tend to suffer from degradation in build quality with increasing scandium content. This manifests as surface roughness due to the formation of disoriented grains protruding from the surface of the film. In the ternary nitride $Al_{100-x}Sc_xN$, there are several competing stable phases. However, the wurtzite $Al_{100-x}Sc_xN$ form is in a non-equilibrium state. Hence, small variations in stress or scandium concentration, for example at a grain boundary, may nucleate an alternative crystal orientation with relative ease. For example, in FIG. 2 we present SEM images of a typical (a) 1.5 micron aluminium nitride film and (b) 1.5 micron $Al_{94}Sc_6N$ film deposited using the same PVD deposition parameters. Whilst the aluminium nitride film shown in FIG. 2(a) is smooth, defect free and relatively featureless, the film formed from the ternary scandium alloy shown in FIG. 2(b) has a high density of pyramidal crystallites embedded in the film. These defects serve to reduce the coupling coefficient and quality factor of the films. Additionally, these defects cause problems for further downstream processing such as film lithography/etching and the deposition of subsequent layers on top of the film. Despite the significant defect levels, the AlScN film exhibits good c-axis orientation and the measured XRD (0002) FWHM (full width half maximum) of less than 1.5° are comparable with the results for pure aluminium nitride films. This confirms that a sputtered AlScN film could be an excellent candidate for the manufacture of high performance BAW filters, provided a method could be found to reduce the defect levels. A defect level of less than 20 per 100 square microns is required in order to contemplate high volume, commercial BAW production. A further proviso for eventual commercialisation would be that the method could be carried out in an economically viable fashion.

SUMMARY

The present invention, in at least some of its embodiments, addresses one or more of the above described problems.

According to a first aspect of the invention there is a provided a method of depositing by pulsed DC reactive sputtering an additive containing aluminium nitride film containing at least one additive element selected from Sc, Y, Ti, Cr, Mg and Hf, the method of comprising the steps of:

depositing a first layer of the additive containing aluminium nitride film onto a film support by pulsed DC reactive sputtering with an electrical bias power applied to the film support; and depositing a second layer of the additive containing nitride film onto the first layer by pulsed DC reactive sputtering with no electrical bias power applied to the film support or with an electrical bias power applied to the film support which is lower than the electrical bias power applied during the sputtering deposition of the first layer, the second layer having the same composition as the first layer.

In this way, improved films can be obtained with relatively low levels of defects.

The at least one additive element may be present in an amount in the range 0.5 At % to 40 At %, preferably in the range 2 At % to 15 At %, and most preferably in the range 3 At % to 10 At %. At these concentrations, the compound can be considered to be an alloy rather than a doped AlN.

The additive containing aluminium nitride film may contain one additive element selected from Sc, Y, Ti, Cr, Mg and Hf. In these embodiments, the additive containing aluminium nitride film may be a ternary alloy. Preferably, the additive containing aluminium nitride film is $Al_{1-x}Sc_xN$.

The first layer may be deposited using an electrical bias power of greater than 70 W. The first layer may be deposited using an electrical bias power of less than 250 W. The first layer may be deposited using an electrical bias power in the range 75 to 200 W.

The second layer may be deposited using an electrical bias power of less than 125 W.

The electrical bias power applied to the film support may be an RF power.

The reactive sputtering may be performed using a magnetron.

The reactive sputtering may be performed using a single target. Generally the target would be a composite target formed from aluminium and the at least one additive element. The use of multiple targets is possible but is likely to be less economically attractive.

The reactive sputtering may be performed in a gaseous atmosphere comprising nitrogen. The gaseous atmosphere may comprise a mixture of nitrogen and an inert gas such as argon.

Generally, the first layer is less tensile than the second layer. Without wishing to be limited by any particular theory or conjecture, it is believed that the use of a higher electrical bias power during the deposition of the first layer results in the first layer being less tensile than the second layer. Again without wishing to be limited by any particular theory or conjecture, it is believed that the first layer helps to align the growth of the second layer, which can result in a film having a relatively low level of defects.

The first layer may have a thickness of less than 250 nm. The first layer may have a thickness in the range 20 to 150 nm.

The additive containing aluminium nitride film may have a thickness of 0.3 micron or greater. Preferably, the additive containing aluminium nitride film has a thickness of 0.6 micron or greater. More preferably, the additive containing aluminium nitride film has a thickness of 1.0 micron or greater. The additive containing aluminium nitride film may have a thickness of 2.0 micron or less. However, thicker films are within the scope of the invention.

In some embodiments, no further layers containing aluminium nitride are deposited onto the second layer. In other words, the additive containing aluminium nitride film consists essentially of the first and second layers.

In other embodiments, the steps of sputter depositing the first and second layers are performed cyclically so that the additive containing aluminium nitride film comprises four or more layers. For example, said steps may be performed cyclically twice to produce an additive containing aluminium nitride film comprising four layers, or the steps may be performed cyclically three times so that the additive containing aluminium nitride film comprises six layers. Other variations are within the scope of the invention.

According to a second aspect of the invention there is provided an additive containing aluminium nitride film manufactured by a method according to the first aspect of the invention.

According to a third aspect of the invention there is provided an additive containing aluminium nitride film containing at least one additive element selected from Sc, Y, Ti, Cr, Mg and Hf, the film comprising first and second layers of the same composition, in which the first and second layers each have an associated stress, and the stress of the first layer is less positive than the stress of the second layer.

According to a fourth aspect of the invention there is provided a piezoelectric device comprising an additive containing aluminium nitride film according to the second or third aspect of the invention. The piezoelectric device may be a BAW device. Generally, the BAW device comprises a first and a second electrode, with the additive containing aluminium nitride film being disposed between the first and second electrodes.

Whilst the invention has been described above, it extends to any inventive combination of the features set out above, or in the following description, drawings or claims. For example, any feature described in relation to one aspect of the invention is considered to be disclosed also in relation to another aspect of the invention.

BRIEF DESCRIPTION OF THE DRAWINGS

Embodiments of films, devices and methods in accordance with the invention will now be described with reference to the accompanying drawings, in which.

DETAILED DESCRIPTION OF EMBODIMENTS

Figure 1:
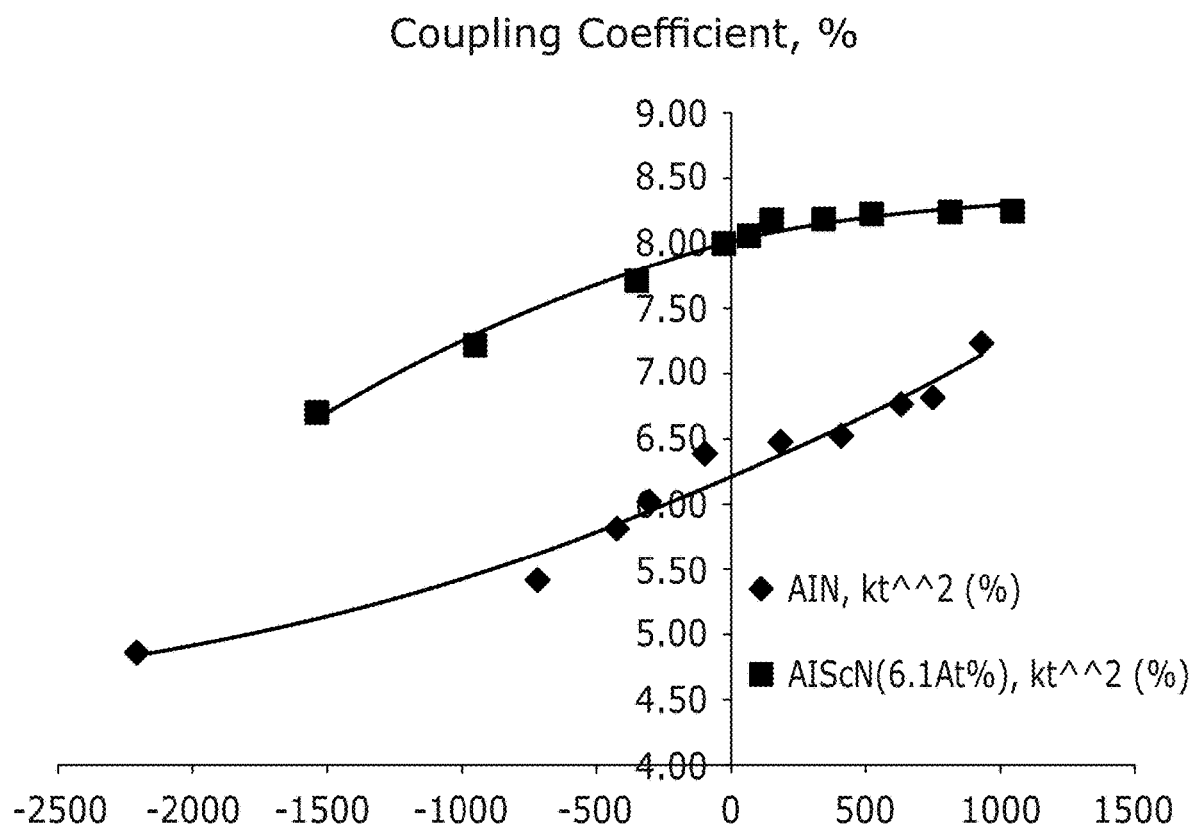
FIG. 1 shows coupling coefficient has a function of film stress for $Al_{93.9}Sc_{6.1}N$ and pure AlN films.
Figure 2:
FIG. 2 shows SEM images of the surfaces of typical 1.3 micron thick (a) AlN film and (b) $Al_{94}Sc_{6}N$ film deposited under the same process conditions.
Figure 2:
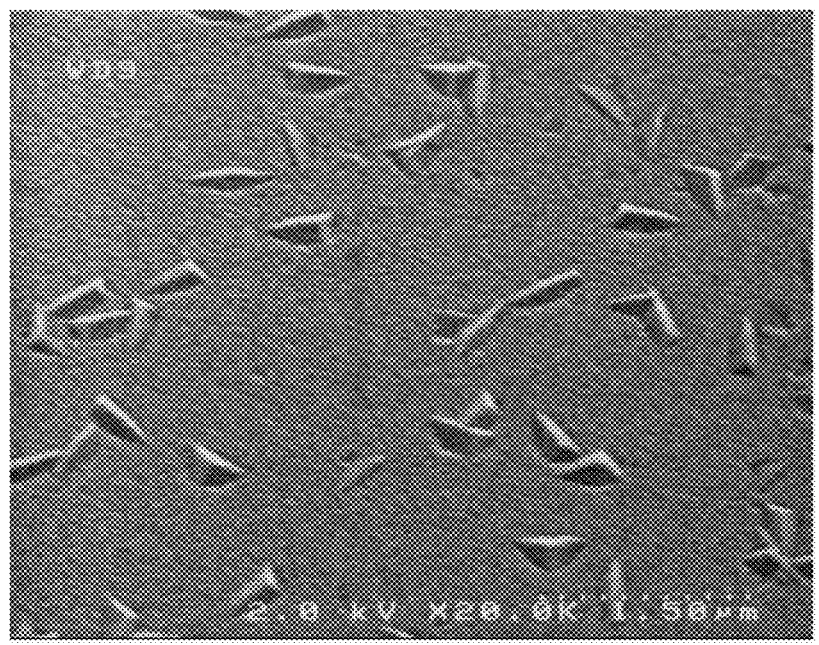

The inventors have discovered an advantageous process for sputter depositing an additive containing aluminium nitride film. The additive containing aluminium nitride film contains at least one additive element selected from Sc, Y, Ti, Cr, Mg and Hf. Results are presented below in relation to $Al_{100-x}Sc_xN$ films where x=6. However, the method is generally applicable to the other additive elements discussed above and to other additive concentrations within the film. The additive containing aluminium nitride film is produced using reactive pulsed DC sputter deposition from an $Al_{100-x}X_x$ target where X represents the additive element. In a first step, a first layer of the additive containing aluminium nitride film is sputter deposited onto a film support such as a platen. RF electrical bias power is applied to the platen during the deposition of the first layer. Then a second layer of the additive containing aluminium nitride film is deposited onto the first layer. During the deposition of the second layer, an RF bias power is applied to the platen which is less than the RF bias power applied during the deposition of the first layer. Alternatively, the second layer may be deposited with no RF bias power applied to the platen.

The film is deposited by pulsed DC reactive sputtering. A composite aluminium scandium target can be used for sputtering in an argon and nitrogen atmosphere. General details concerning apparatus which can be used or readily adapted for use in the present invention are well known to the skilled reader, such as the apparatus described in the Applicant's European patent application EP2871259, the entire contents of which are hereby incorporated by reference. It has been found that it is possible to substantially reduce the growth of single, out of plane crystallite defects using the invention. This allows films to be deposited with a smooth surface and low enough defect levels to allow successful volume manufacture of additive containing aluminium nitride alloy films. This also paves the way to successful volume manufacture of associated piezoelectric devices such as BAW filters. Relatively thick additive containing aluminium nitride films can be deposited in this way, for example, films having thicknesses in the 1-2 micron range. However, films of smaller or larger thicknesses can also be deposited. In general, the thickness of the first layer is relatively small. A representative but non-limiting range of thicknesses for the first layer is about 20-100 nm.

1200 nm $Al_{0.94}Sc_{0.06}N$ films were sputter deposited using a single target using this method. These films comprise a 90 nm first layer produced using a high RF bias on the platen, and a 1110 nm second layer deposited using a low RF bias on the platen. Films of this composition were also deposited using a continuous, single sputter deposition of the type known in the prior art. Typical deposition parameters for the experiments conducted on 150 mm wafers are shown in Table 1. Typical process pressures are in the range 4 to 12 mTorr. Deposition rates in excess of 60 nm/min have been achieved using these conditions.

TABLE 1

Typical process parameters for two $Al_{94\%}Sc_{6\%}N$ step process.

| | AlScN-High bias step | AlScN-low bias bulk step |
|---|---|---|
| Film thickness nm | 25-100 nm | 1300 |
| Pulse DC power KW | 6 | 6 |
| Pulse frequency KHz | 100 | 100 |
| Pulse width us | 4 | 4 |
| Ar flow sccm | 10 | 10 |
| N2 flow sccm | 50 | 50 |
| Platen RF bias power Watts | 80-150 | Adjust for required stress |
| Platen temperature ° C. | 200 | 200 |

Figure 3:
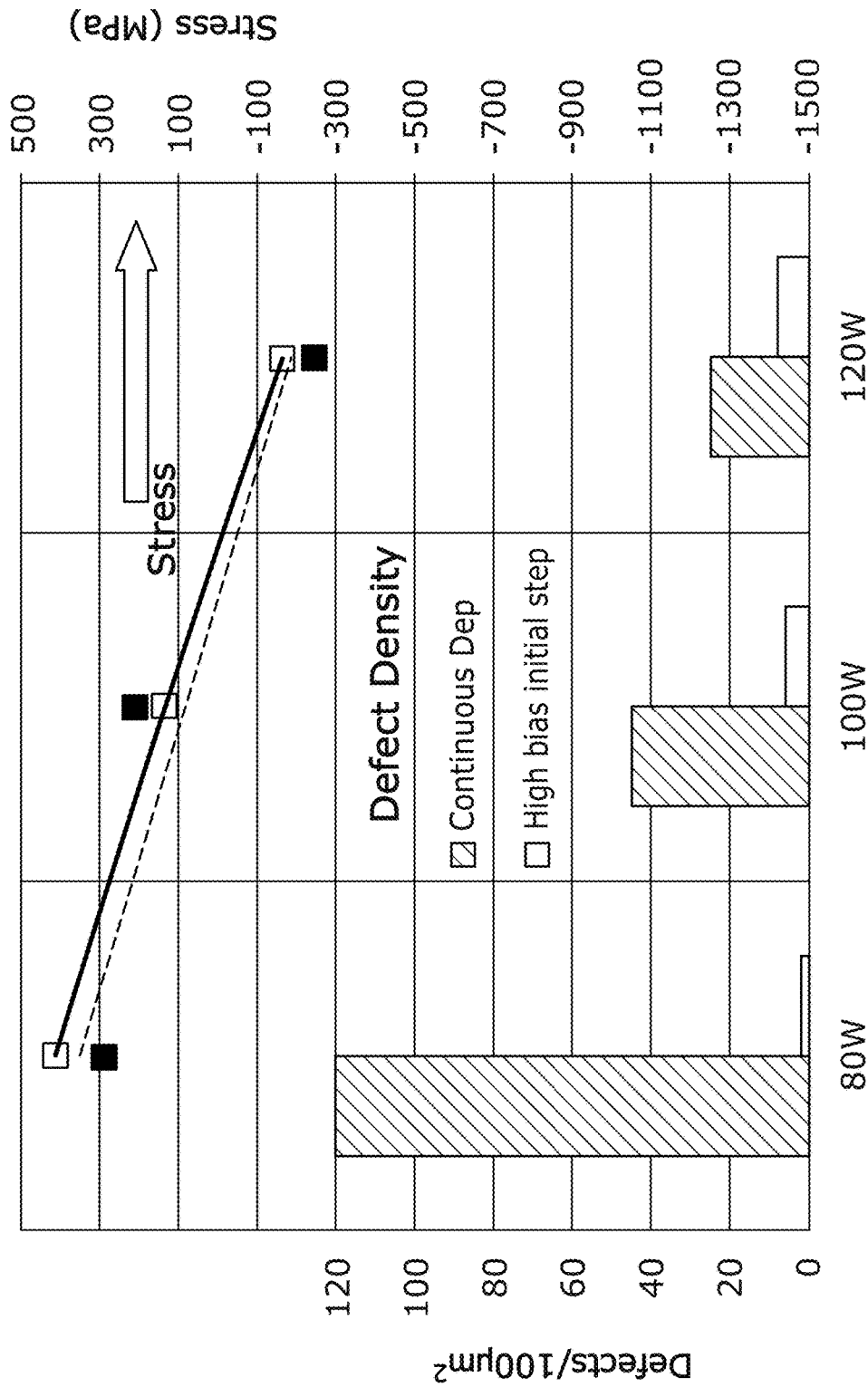
FIG. 3 shows defect density and film stress as a function of platen RF bias for continuous depositions and two-step depositions of $Al_{94}Sc_{6}N$ films.

FIG. 3 shows the defect density (in defects per 100 square microns) and stress of the film (in MPa) for both the continuous, single deposition and the two-step process of the invention. The data are shown as a function of the applied RF bias on the platen (80 W, 100 W, 120 W). In FIG. 3, defectivity data shown as hatched bars relate to the films produced by a continuous, single deposition. It can be seen that increasing the RF bias improved defectivity although the defect density remains above 20 defects/100 square microns. However, it can also be seen that the improved defectivity at high RF bias results in a compressive film (stress data for the continuous, single deposition films are shown as black squares). In contrast, the two-step sputter deposition process of the invention results in excellent defectivity values of less than 20 defects/100 square microns for all RF bias powers (unhatched bars). The overall stress of the film produced by the two-step process is variable, and can be seen to range from quite strongly tensile values to quite strongly compressive values (unfilled squares). This enables the user to choose the stress of the deposited film whilst obtaining excellent defectivity values.

Figure 4:
FIG. 4 shows SEM images of the surface of an AlScN film with a high bias initiation step (a) at the centre and (b) at the edge of the film.
Figure 4:
Figure 5:
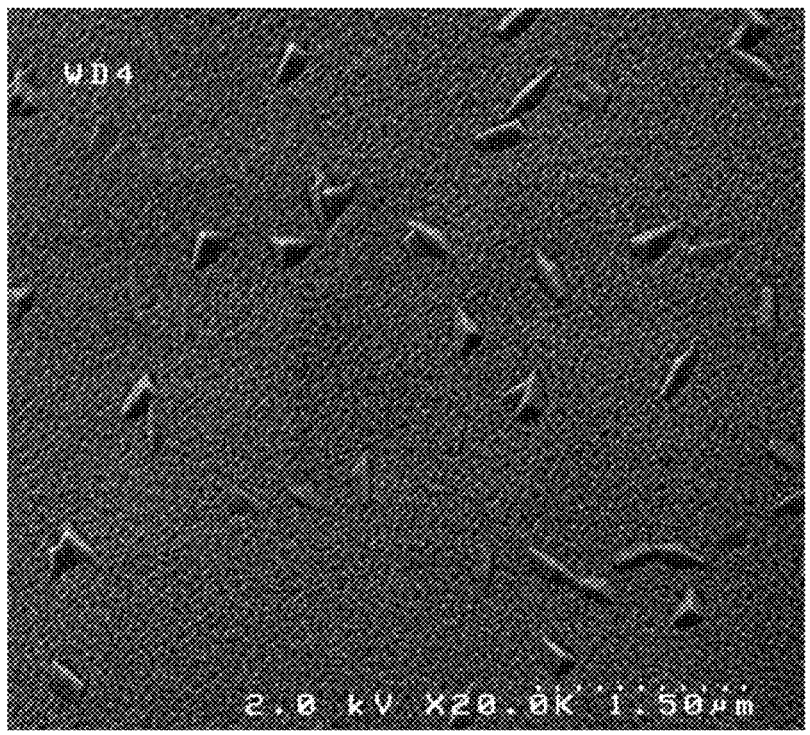
FIG. 5 shows SEM images of the surface of an AlScN film deposited using a continuous deposition (a) in the centre and (b) at the edge of the film.
Figure 5:
Figure 6:
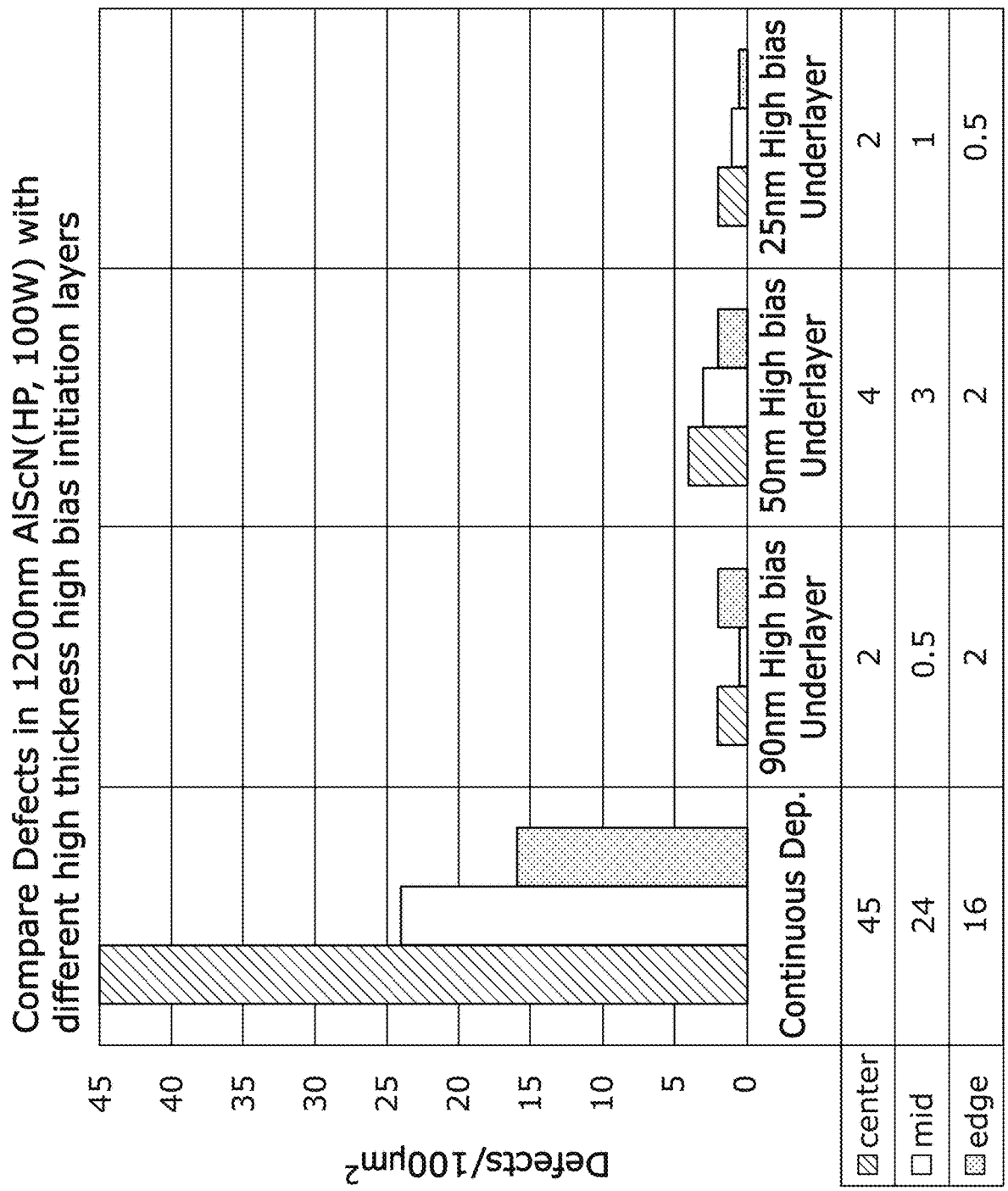
FIG. 6 shows defect densities for 1200 nm $Al_{94}Sc_{6}N$ films produced using continuous deposition and using two-step deposition with a variety of thicknesses of the first deposited film.

The improvement in film quality can be clearly seen in FIGS. 4 and 5. FIG. 4 shows SEM images at the centre and the edge of the $Al_{0.94}Sc_{0.06}N$ films deposited using the two-step process of the invention. FIG. 6 shows SEM images of the centre and edge of tensile $Al_{0.94}Sc_{0.06}N$ films deposited using continuous sputter deposition. The defect density data shown in FIG. 3 were measured at the centres of the films. Defect levels can vary quite substantially between the centre and edge of the films. This is likely to be related to the centre to edge stress variation which inherently occurs across a film deposited by magnetron sputtering systems. This can be attributed to variations in plasma density across the film caused by the DC magnetron and any centre to edge temperature variation across the platen. Table 2 shows the variation in defect density from the centre to the edge of films produced by single, continuous deposition and by the two-step process of the invention. Table 2 shows that the defect density was maintained below 20 defects/100 square microns for the two-step process across the entire area of the film. Furthermore, the stress of these films is tunable from highly compressive to highly tensile. In fact, the lowest defect densities were observed with the most tensile film produced. This film would be likely to exhibit the highest coupling coefficient as well. In addition, all of the films exhibited excellent c-axis orientation with a FWHM<1.5°. This satisfies a further requirement for BAW production in a high volume manufacturing environment. Table 2 also shows that the defect densities observed across the films produced by a single, continuous deposition are inferior to all of the films produced using the two-step process of the invention.

TABLE 2

Defect Density, Stress and XRD Texture for 1200 nm AlScN films produced (a) by a Single Continuous Deposition and (b) with a 90 nm High RF Bias initial step

| Process | Platen RF | Stress (MPa) | Defects/100 μm² | | | FWHM (0002) | |
|---|---|---|---|---|---|---|---|
| | | | center | mid | edge | center | edge |
| Continuous Deposit | 80 W | 288 | 120 | 76 | 28 | 1.488 | 1.588 |
| 90 nm 150 W Initial step | | 385 | 2 | 0 | 0.5 | 1.368 | 1.32 |
| Continuous Deposit | 100 W | 210 | 45 | 24 | 16 | 1.496 | 1.496 |
| 90 nm 150 W Initial step | | 136 | 6 | 3 | 1 | 1.33 | 1.44 |
| Continuous Deposit | 120 W | −265 | 24 | 10 | 7 | 1.508 | 1.484 |
| 90 nm 150 W Initial step | | −164 | 8 | 1 | 2 | 1.48 | 1.525 |

Experiments were also performed to investigate the effect of the thickness of the first layer on the defect density of films produced using the two-step process. Common process conditions were used to produce moderately tensile (about 200 MPa) $Al_{0.94}Sc_{0.06}N$ films in which the thickness of the first layer varied from 25 nm to 90 nm. FIG. 6 also shows defect densities measured on films of the same composition and thickness deposited using the continuous, single deposition technique. The thickness of all films investigated was 1200 nm. All of the films produced using the two-step process of the invention show a significant improvement in film quality at all thicknesses of the first layer. In comparison to the films produced using the single, continuous sputter deposition technique, defect densities are reduced by about 10:1. Excellent data are obtained when the first layer (produced with a high RF bias on the platen) is only 25 nm thick. Increasing the thickness of the first layer further does not appear to result in a statistically significant improvement in the defect density.

The experiments described above relate to films made up of two layers of the additive containing aluminium nitride film, in which the first layer is sputter deposited using a relatively high RF bias power applied to the platen, followed by sputter deposition of the second layer using a lower RF bias power. It is also within the scope of the invention to deposit further layers of the additive containing aluminium nitride film. In particular, it is possible to perform the sputter deposition of the first and second layers in a cyclical fashion.

Figure 7:
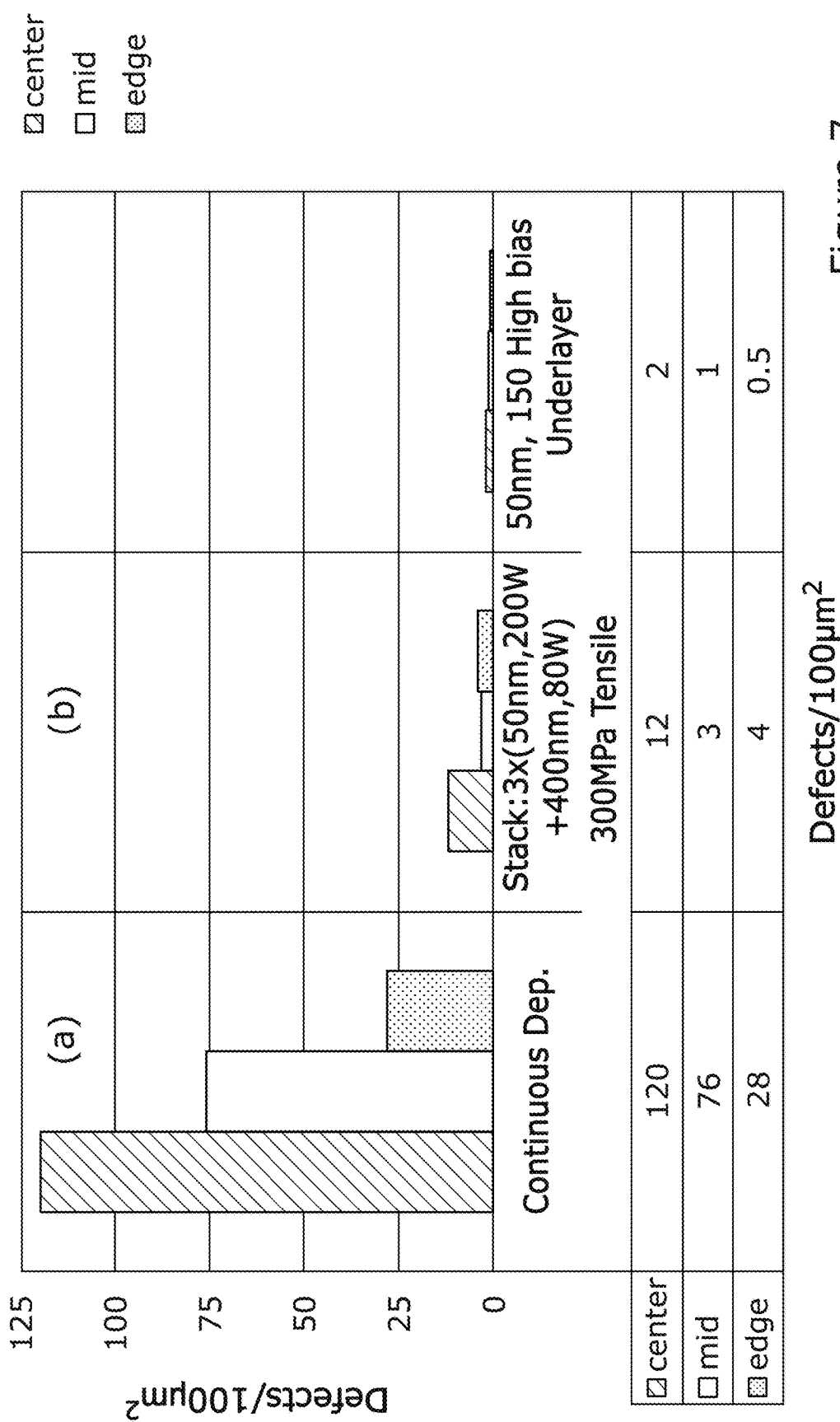
FIG. 7 shows defect levels for AlScN films deposited (a) in a single prior art continuous deposition (b) using three cycles of depositions with high and low RF biases and (c) with a two-step deposition using a first step with high RF bias first layer.

Experiments were performed to investigate whether film defect density could be improved by employing alternating steps using a relatively high RF bias and a lower RF bias. AlScN films were deposited as stacks produced by three consecutive cycles of a first step at an RF bias power of 200 W and a second step at an RF bias power of 80 W. The high RF bias power step was performed to produce a layer 50 nm thick, and the lower RF bias power step was performed to produce a layer 400 nm thick. Three cycles were performed so that the film comprises six layers, of which three are relatively thin layers produced using the high RF bias and three are relatively thick layers produced using the lower RF bias. Defect densities were measured at the centre, the mid portion and the edge of films and the results are shown in FIG. 7(b). By comparison, FIG. 7(a) shows defect density data obtained from films of the same composition and similar thicknesses obtained using a single, continuous deposition. FIG. 7(c) shows defect density data obtained for films of the same composition of similar thicknesses produced using a two-step process of the invention in which a 50 nm thick first layer is deposited using an RF bias power of 150 W. In terms of defect density, the best results were obtaining using the two-step process. However, the defect densities observed with the six layer stack are also excellent, and represent a considerable improvement on the films obtained by a single, continuous deposition. It is considered that the cyclical method may be particularly useful for producing relatively thick additive containing aluminium nitride films, for example films having a total thickness of greater than 1.5 microns.

Without wishing to be limited by any particular theory or conjecture, it is believed that the use of a higher electrical bias power during the deposition of the first layer can result in the first layer being less tensile than the second layer. Again without wishing to be limited to any particular theory or conjecture, it is believed that the first layer can help to align film growth during the sputter deposition process of the second layer. Process conditions for the layers can be varied by the user in order to optimise one or more properties of the film, for example film stress or electromechanical coupling coefficient. The additive containing aluminium nitride films of the invention can be utilised in a wide range of end applications, of which BAW devices are one example.

What is claimed is:

1. A sputtering method of forming an additive element containing aluminum nitride film of a piezoelectric device, the method comprising:

depositing aluminum nitride containing at least one additive element onto a film support of the piezoelectric device by applying pulsed DC electrical current to a single target comprising Al and the at least one additive element and with an electrical bias power applied to the film support of the piezoelectric device, to thereby sputter material from the target and form a first layer of the additive containing aluminum nitride film of the piezoelectric device; and depositing aluminum nitride containing the at least one additive element onto the first layer by applying pulsed DC electrical current to the target and with no electrical bias power applied to the film support or with an electrical bias power applied to the film support of the piezoelectric device which is lower than the electrical bias power applied during the forming of the first layer, to thereby sputter material from the target and form a second layer of the additive containing aluminum nitride film of the piezoelectric device on the first layer, in which the at least one additive element comprises at least one element selected from the group consisting of Sc and Y, the second layer has the same composition as the first layer, and the electrical bias power applied to the film support of the piezoelectric device in the forming of the first layer is an RF power.

2. A method according to claim 1 in which the at least one additive element is present in an amount in the range 0.5 At % to 40 At %.

3. A method according to claim 1 in which the at least one additive element is present in an amount in the range 2 At % to 15 At %.

4. A method according to claim 1 in which the at least one additive element is present in an amount in the range 3 At % to 10 At %.

5. A method according to claim 1 in which the additive containing aluminum nitride film of the piezoelectric device contains only one additive element, the one additive element being Sc or Y.

6. A method according to claim 1 in which the forming of the first layer is carried out with an electrical bias power of greater than 70 W applied to the film support of the piezoelectric device.

7. A method according to claim 4 in which the forming of the first layer is carried out with an electrical bias power of less than 250 W applied to the film support.

8. A method according to claim 1 in which the forming of the second layer is carried out with an electrical bias power of less than 125 W applied to the film support.

9. A method according to claim 1 in which the first layer is less tensile that the second layer.

10. A method according to claim 1 in which the first layer is formed to a thickness in the range 20 to 150 nm.

11. A method according to claim 1 in which the additive containing aluminum nitride film of the piezoelectric device is formed to a thickness of 0.3 micron or greater.

12. A method according to claim 10 in which the additive containing aluminum nitride film of the piezoelectric device is formed to a thickness of 2.0 micron or less.

13. A method according to claim 1 in which the additive containing aluminum nitride film of the piezoelectric device is formed to a thickness of 0.6 micron or greater.

14. A method according to claim 13 in which the additive containing aluminum nitride film of the piezoelectric device is formed to a thickness of 2.0 micron or less.

15. A method according to claim 1 in which no further additive containing aluminum nitride is deposited onto the second layer.

16. A method according to claim 1 in which the forming of the first and second layers is performed cyclically so that the additive containing aluminum nitride film of the piezoelectric device comprises four or more layers.

17. A method according to claim 1 in which the first layer is formed to a thickness in the range 20 to 150 nm, and the additive containing aluminum nitride film of the piezoelectric device is formed to a thickness of 0.6 micron or greater.

* * * * *